US007025861B2

(12) United States Patent
Kovarsky et al.

(10) Patent No.: US 7,025,861 B2
(45) Date of Patent: Apr. 11, 2006

(54) CONTACT PLATING APPARATUS

(75) Inventors: Nicolay Kovarsky, Sunnyvale, CA (US); Michael Yang, Palo Alto, CA (US); Dmitry Lubomirsky, Cupertino, CA (US)

(73) Assignee: Applied Materials, Santa Clara, CA (US)

( * ) Notice: Subject to any disclaimer, the term of this patent is extended or adjusted under 35 U.S.C. 154(b) by 330 days.

(21) Appl. No.: 10/360,234

(22) Filed: Feb. 6, 2003

(65) Prior Publication Data

US 2004/0154915 A1    Aug. 12, 2004

(51) Int. Cl.
*C25F 3/30* (2006.01)
*B23H 5/06* (2006.01)
*C25D 7/12* (2006.01)
*C25D 5/22* (2006.01)

(52) U.S. Cl. .................. 204/242; 205/93; 205/663
(58) Field of Classification Search ............ 204/237, 204/252; 205/93
See application file for complete search history.

(56) References Cited

U.S. PATENT DOCUMENTS

| 3,649,509 A | 3/1972 | Morawetz et al. ......... 204/238 |
| 3,727,620 A | 4/1973 | Orr ............................ 134/95 |
| 3,770,598 A | 11/1973 | Creutz .................... 204/52 R |
| 4,027,686 A | 6/1977 | Shortes et al. ............. 134/33 |
| 4,092,176 A | 5/1978 | Kozai et al. .............. 134/186 |
| 4,110,176 A | 8/1978 | Creutz et al. .......... 204/52 R |
| 4,113,492 A | 9/1978 | Sato et al. .................. 96/67 |
| 4,304,641 A | 12/1981 | Grandia et al. ............ 204/23 |
| 4,315,059 A | 2/1982 | Raistrick et al. .......... 429/112 |
| 4,326,940 A | 4/1982 | Eckles et al. ............. 204/232 |
| 4,336,114 A | 6/1982 | Mayer et al. ........... 204/52 R |
| 4,376,685 A | 3/1983 | Watson ..................... 204/52 R |
| 4,405,416 A | 9/1983 | Raistrick et al. ............ 204/68 |
| 4,428,815 A | 1/1984 | Powell et al. .......... 204/297 W |
| 4,435,266 A | 3/1984 | Johnston ................... 204/276 |
| 4,489,740 A | 12/1984 | Rattan et al. .............. 134/140 |
| 4,510,176 A | 4/1985 | Cuthbert et al. ............ 427/82 |

(Continued)

FOREIGN PATENT DOCUMENTS

JP     58182823     10/1983

(Continued)

OTHER PUBLICATIONS

Colombo, "Wafer Back Surface Film Removal," Central R&D, SGS-Thomson Microelectronics, Agate Italy.

(Continued)

*Primary Examiner*—Harry D. Wilkins, III
(74) *Attorney, Agent, or Firm*—Patterson and Sheridan

(57) ABSTRACT

Embodiments of the invention generally provide a substrate processing system and method. The substrate processing system generally includes a fluid basin configured to contain a plating solution therein, an anode assembly positioned in a lower portion of the fluid basin, a separation membrane positioned across the fluid basin above the anode assembly, a diffusion member positioned across the fluid basin above the separation membrane, and a plating membrane positioned across the fluid basin above the diffusion member. The plating method generally includes immersing the substrate in a plating solution, the plating solution containing metal ions to be plated, contacting a plating surface of the semiconductor substrate with a plating membrane, applying a plating bias to the semiconductor substrate to plate the metal ions in the plating solution positioned adjacent the plating surface of the substrate, removing the plating surface from contact with the plating membrane for a predetermined period of time, and recontacting the plating surface with the plating membrane to continue plating the metal ions onto the plating surface.

15 Claims, 3 Drawing Sheets

U.S. PATENT DOCUMENTS

| | | | |
|---|---|---|---|
| 4,518,678 A | 5/1985 | Allen | 430/311 |
| 4,519,846 A | 5/1985 | Aigo | 134/15 |
| 4,693,805 A | 9/1987 | Quazi | 204/192.22 |
| 4,732,785 A | 3/1988 | Brewer | 427/240 |
| 4,789,445 A | 12/1988 | Goffman et al. | 204/114 |
| 5,039,381 A | 8/1991 | Mullarkey | 204/47.5 |
| 5,055,425 A | 10/1991 | Leibovitz et al. | 437/195 |
| 5,092,975 A | 3/1992 | Yamamura et al. | 204/198 |
| 5,155,336 A | 10/1992 | Gronet et al. | 219/411 |
| 5,162,260 A | 11/1992 | Leibovitz et al. | 437/195 |
| 5,222,310 A | 6/1993 | Thompson et al. | 34/302 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,281,325 A | 1/1994 | Berg | 205/125 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,349,978 A | 9/1994 | Sago et al. | 134/153 |
| 5,377,708 A | 1/1995 | Bergman et al. | 134/105 |
| 5,429,733 A | 7/1995 | Ishida | 204/224 R |
| 5,447,615 A | 9/1995 | Ishida | 204/224 R |
| 5,516,412 A | 5/1996 | Andricacos et al. | 204/224 R |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 6,103,085 A | 8/2000 | Woo et al. | 205/143 |
| 6,103,628 A | 8/2000 | Talieh | 438/692 |
| 6,176,992 B1 | 1/2001 | Talieh | 205/87 |
| 6,207,572 B1 | 3/2001 | Talieh | 438/692 |
| 6,251,235 B1 | 6/2001 | Talieh et al. | 204/220 |
| 6,251,250 B1 | 6/2001 | Keigler | 205/89 |
| 6,274,010 B1 | 8/2001 | Henington et al. | 204/230.3 |
| 6,328,872 B1 | 12/2001 | Talieh et al. | 205/206 |
| 6,352,623 B1 | 3/2002 | Volodarsky et al. | 204/275.4 |
| 6,355,153 B1 | 3/2002 | Uzoh et al. | 205/87 |
| 6,402,925 B1 | 6/2002 | Talieh | 205/222 |
| 6,409,904 B1 | 6/2002 | Uzoh et al. | 205/137 |
| 6,413,388 B1 | 7/2002 | Uzoh et al. | 204/224 R |
| 6,413,403 B1 | 7/2002 | Lindquist et al. | 205/97 |
| 6,464,571 B1 | 10/2002 | Talieh et al. | 451/296 |
| 6,468,139 B1 | 10/2002 | Talieh et al. | 451/296 |
| 6,471,847 B1 | 10/2002 | Talieh et al. | 205/147 |
| 6,478,936 B1 | 11/2002 | Volodarsky et al. | 204/286.1 |
| 6,482,307 B1 | 11/2002 | Ashjaee et al. | 205/103 |
| 6,497,800 B1 | 12/2002 | Talieh et al. | 204/224 R |
| 6,514,258 B1 | 2/2003 | Brown et al. | 606/80 |
| 6,527,920 B1 * | 3/2003 | Mayer et al. | 204/237 |
| 6,534,116 B1 | 3/2003 | Basol | 427/97 |

FOREIGN PATENT DOCUMENTS

| | | |
|---|---|---|
| JP | 63118093 | 5/1988 |
| JP | 4131395 | 5/1992 |
| JP | 4280993 | 10/1992 |
| JP | 6-17291 | 1/1994 |
| WO | 97/12079 | 4/1997 |
| WO | 99/25902 | 5/1999 |
| WO | 99/25903 | 5/1999 |
| WO | 99/25904 | 5/1999 |
| WO | 99/25905 | 5/1999 |
| WO | 99/26275 | 5/1999 |

OTHER PUBLICATIONS

Semitool Product Catalog (on-line) Oct. 27, 1998.

Singer, "Copper Has Enormous Benefits When Compared to Aluminum, but its Implementation Requires Some Fundamental Changes in Process Technologies," Semiconductor International Jun. 1998.

Singer, "Wafer Processing," Semiconductor International Jun. 1998.

Pitney, "Ney Contact Manual" Oct. 1974.

* cited by examiner

CONTACT PLATING APPARATUS

BACKGROUND OF THE INVENTION

1. Field of the Invention

Embodiments of the invention generally relate to semiconductor processing system, and more particularly, embodiments of the invention relate to a contact electrochemical plating apparatus and method.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 4:1, interconnect features with a conductive material, such as copper or aluminum. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. Therefore, plating techniques, i.e., electrochemical plating (ECP) and electroless plating, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material, such as copper. ECP plating processes are generally multistage processes, wherein a substrate is prepared for plating, i.e., one or more preplating processes, brought to a plating cell for a plating process, and then the substrate is generally post treated after the plating process. The preplating process generally includes processes such as depositing a barrier/diffusion layer and/or a seed layer on the substrate, precleaning the seed layer and/or substrate surface prior to commencing plating operations, and other preplating operations that are generally known in the art. Once the preplating processes are complete, the substrate is generally transferred to a plating cell where the substrate is contacted with a plating solution and the desired plating layer is deposited on the substrate. Once the plating processes are complete, then the substrate is generally transferred to a post treatment cell, such as a rinse cell, bevel clean cell, drying cell, or other post treatment process cell generally used in the semiconductor art.

However, one challenge associated with conventional plating systems is that it is difficult to provide a uniform plating thickness above both narrow and wide features. For example, conventional plating systems are prone to a characteristic generally termed mounding, which is when the material plated over a substrate having both narrow and wide features accumulates faster or has a greater thickness over the narrow features as compared to the wider features. The result of this characteristic is a buildup or mound of the plated material above the narrow features, which is undesirable for subsequent processing steps, such as chemical mechanical polishing, edge bead removal, electrochemical polishing, and other post plating processes. In response to this challenge, contact-type plating systems have been developed. Contact-type plating systems generally include a pad or membrane in an upper portion of the plating cell, wherein the pad or membrane is configured to contact the plating surface during plating operations. This contact generally operates to minimize mounding characteristics. However, one disadvantage of contact-type plating apparatuses is that it is difficult to obtain sufficient fresh electrolyte flow to the substrate surface as a result of the fluid restriction characteristics generated by the membrane. More particularly, contact-type plating systems generally fail to provide a sufficient flow of fresh electrolyte to the center of the substrate, and as a result thereof, the center of the substrates are generally burned by the plating process.

Therefore, there is a need for a contact-type plating apparatus and method, wherein the apparatus and method are configured to supply sufficient fresh electrolyte to the substrate surface during plating operations to prevent burning characteristics.

SUMMARY OF THE INVENTION

Embodiments of the invention may generally provide an apparatus and method for electrochemically plating a layer onto a semiconductor substrate. The apparatus generally includes a plating cell configured to conduct an electrochemical plating process, however, the plating cell is configured to contact the plating surface of the substrate with a plating membrane. The plating membrane generally includes channels formed therethrough in a configuration such that a supply of fresh electrolyte may be communicated to the plating surface of the substrate, while alternative channels formed through the membrane may be used to remove used or depleted electrolyte from the surface of the substrate. The method for electrochemically plating a layer onto a substrate may generally include contacting the plating surface of the substrate with the membrane. A plating solution may be supplied to the plating surface via supply channels formed into the membrane, and used electrolyte may be communicated away from the plating surface by recirculation channels formed through the membrane. Additionally, inasmuch as the physical contact between the membrane and the substrate may inhibit electrolyte from freely flowing from the membrane supply channels, the membrane may be periodically removed from contact with the substrate for a short duration of time in order to allow fresh electrolyte to be supplied to the plating surface.

Embodiments of the invention may further provide a substrate processing system that generally includes a fluid basin configured to contain a plating solution therein, an anode assembly positioned in a lower portion of the fluid basin, and a separation membrane positioned across the fluid basin above the anode assembly. The processing system may further include a diffusion member positioned across the fluid basin above the separation membrane, and a plating membrane positioned across the fluid basin above the diffusion member.

Embodiments of the invention may further provide an electrochemical processing system. The processing system generally includes a cell configured to contain an electrolyte solution, an anode positioned in the electrolyte solution, a separation membrane sealably positioned to an inner wall of the cell above the anode, and a diffusion member sealably positioned to the inner wall of the cell above the separation membrane. The cell further includes a plating membrane sealably positioned to the inner wall of the cell above the separation membrane, the plating membrane having a top and bottom surfaces, the bottom surface being positioned adjacent the diffusion member and the top surface being positioned adjacent a plating surface of a substrate, a plurality of fluid supply channels fluidly connecting the first and second surfaces, and a plurality of fluid recirculation channels in fluid communication with the top surface and a drain channel.

Embodiments of the invention may further provide a method for plating a metal onto a semiconductor substrate. The plating method generally includes immersing the substrate in a plating solution, the plating solution containing metal ions to be plated, contacting a plating surface of the semiconductor substrate with a plating membrane, applying a plating bias to the semiconductor substrate to plate the metal ions in the plating solution positioned adjacent the plating surface of the substrate, removing the plating surface from contact with the plating membrane for a predetermined period of time, and recontacting the plating surface with the plating membrane to continue plating the metal ions onto the plating surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
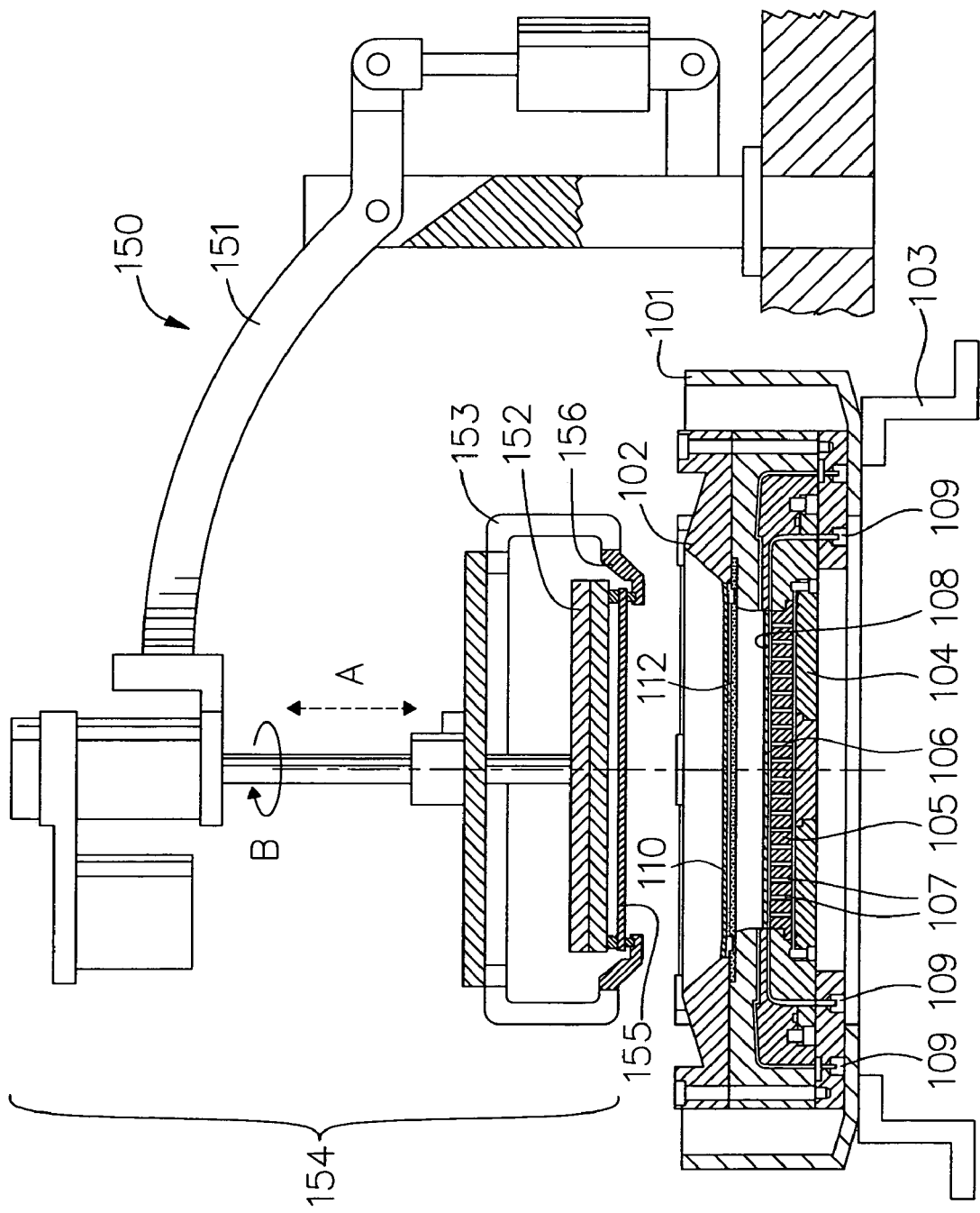
FIG. 1 illustrates a sectional view of an exemplary plating cell and head assembly of the invention.

FIG. 1 illustrates a perspective and partial sectional view of an exemplary contact-type electrochemical plating cell 100 and head assembly 150 of the invention. Head assembly 150 generally includes a support frame 151 configured to support a substrate contact assembly 154. The substrate contact assembly 154 generally includes a vertically actuated thrust plate 152 and a substrate contact ring 153. A substrate 155 to be processed is generally placed on contact ring 153, which provides an electrical plating bias to substrate 155 via contact pins 156. Once the substrate is placed on the contact ring 153, the thrust plate 152 may be lowered, i.e., in the direction indicated by arrow A, to engage the backside of the substrate and secure the substrate in the contact ring 153 for plating operations. Further, head assembly 150 may also be rotated, as illustrated by arrow B, to facilitate plating, rinsing, or drying processes. In another embodiment of the invention the head assembly utilizes a vacuum chuck-type of substrate securing method. For example, in this embodiment a conductive seed layer formed on the substrate may be extended around the bevel edge of the substrate at least partially onto the backside of the substrate. Then, a vacuum chuck-type substrate support may be used to secure the substrate thereto for processing with the production surface of the substrate facing away from the vacuum chuck. Further, the substrate engaging surface of the vacuum chuck may include a plurality of electrical contact pins configured to electrically engage the substrate, and more particularly, the contact pins are generally configured to engage the substrate in the area where the seed layer is extended onto the backside of the substrate. In this embodiment there will not be any frontside or production surface contact with the substrate, which minimizes interference with the plating membrane.

Plating cell 100 generally includes an outer basin 101 and an inner basin 102 positioned within outer basin 101. Inner basin 102 is generally configured to contain a plating solution that is used to plate a metal, e.g., copper, onto a substrate during an electrochemical plating process. During the plating process, the plating solution is generally continuously supplied to inner basin 102 (at about 1–5 gallons per minute for a 10 liter plating cell, for example), and therefore, the plating solution may overflow the uppermost point of inner basin 102 and run into -outer fluid recovery basin 101 where it may be collected and recycled for subsequent use. Although not illustrated in FIG. 1, plating cell 100 may be positioned at a tilt angle, i.e., the frame portion 103 of plating cell 100 may be elevated on one side such that the components of plating cell 100 are tilted between about 3° and about 30° from horizontal. Therefore, in order to contain an adequate depth of plating solution within inner basin 102 during plating operations, the uppermost portion of basin 102 may be extended upward on one side of plating cell 100, such that the uppermost point of inner basin 102 is generally horizontal and allows for contiguous overflow of the plating solution supplied thereto around the perimeter of basin 102.

The lower portion of plating cell 100 generally includes an annular anode base member 104 that is also positioned at the aforementioned tilt angle, i.e., the upper surface of the base member is generally tilted from horizontal. Base member 104 generally includes an annular or disk shaped recess formed into a central portion thereof, wherein the annular recess is configured to receive a disk shaped or annular anode member 105. Base member 104 may further include a plurality of fluid inlets/drains 109 positioned on a lower surface thereof. Each of the fluid inlets/drains 109 are generally configured to individually supply or drain a fluid to or from either the anode compartment or the cathode compartment of plating cell 100. Anode member 105 generally includes a plurality of slots 107 formed therethrough, wherein the slots 107 are generally positioned in parallel orientation with each other across the surface of the anode 105. The parallel orientation allows for dense fluids generated at the anode surface to flow downwardly across the anode surface and into one of the slots 107. Plating cell 100 further includes a membrane support assembly 106 configured to receive a membrane 108 thereover, i.e., the membrane may be stretched over the membrane support and use the membrane support as structural support thereof. The membrane support assembly 106 may include an O-ring type seal positioned near a perimeter of the membrane, wherein the seal is configured to prevent fluids from traveling from one side of the membrane secured on the membrane support 106 to the other side of the membrane. The membrane 108 secured to the membrane support assembly 106 may be an ionic membrane, a fluid permeable membrane, or other type of membrane capable of being used in an electrochemical plating cell. Plating cell 100 further includes a diffusion member 112 positioned across an upper portion of cell 100 above membrane 108. Diffusion member is generally a porous disk shaped member that is sealably attached to the inner wall of basin 102 such that fluid traveling upward through cell 100 must pass through diffusion member in order to reach a substrate being plated in cell 100. Although embodiments of the invention are not limited to any particular construction of diffusion member 112, porous ceramic materials may be used to manufacture diffusion member 112, as these members provide a generally uniform fluid flow therethrough and offer ample flux control characteristics. Further, diffusion member 112 is generally sealably attached to the inner wall of the inner basin 102, and therefore, fluid traveling upward must generally travel through diffusion member 112. Diffusion member 112 generally includes a substantially planar upper surface, which is generally configured to receive a plating membrane (further discussed herein) thereon during plating operations. Further still, the outer perimeter of diffusion member 112 may include an annular channel formed therein, wherein the annular channel is sized to receive a bottom portion of a contact ring therein. This allows for a substrate being plated in cell 100 to be positioned in abutment with a plating membrane resting on the upper surface of the diffusion member 112, as the portions of the contact ring that extend below the substrate may be received in the annular channel formed into the diffusion member 112.

During plating operations, a plating solution is generally supplied to the volume in the plating cell 100 above membrane 108, while a separate fluid solution is generally supplied to the volume within plating cell below membrane 108. More particularly, generally an anolyte solution, i.e., a plating solution that does not contain plating additives (levelers, suppressors, accelerators, etc), is supplied to the anode chamber, wherein the anode chamber is generally defined as the volume of the plating cell 100 below membrane 108. A catholyte solution, i.e., a plating solution having a chosen concentration of plating additives therein (levelers, suppressors, accelerators, etc) is supplied to the catholyte chamber, wherein the catholyte chamber is generally defined as the volume of the plating cell above membrane 108.

In addition to membrane 108 used in the plating cell to separate the anode compartment from the cathode compartment, a secondary plating membrane or plating pad 110 may be positioned across a top portion of the plating cell 100. Plating membrane 110, which is generally referred to in the semiconductor plating art as a plating pad or plating membrane, is generally positioned to be in contact with or submerged in the electrolyte solution contained within inner basin 102. In similar fashion to the membrane positioned on the membrane support 106, plating membrane 110 may also be sealed to the outer perimeter of inner basin 102. In this configuration the plating solution applied to the inner basin would be required to flow through the plating membrane 110 before being collected in outer basin 101 for recycling. Further, plating membrane 110 is generally positioned such that when a substrate is brought into a processing position, i.e., when a substrate is lowered into the plating solution contained within inner basin 102 by a head assembly or other means of supporting a substrate for processing steps, plating membrane 110 is generally in contact with the plating surface of the substrate. Plating membrane 110 is generally fluid permeable, and therefore, the plating solution contained within inner basin 102 generally passes through the plating membrane 110 to contact the plating surface of the substrate.

Figure 2:
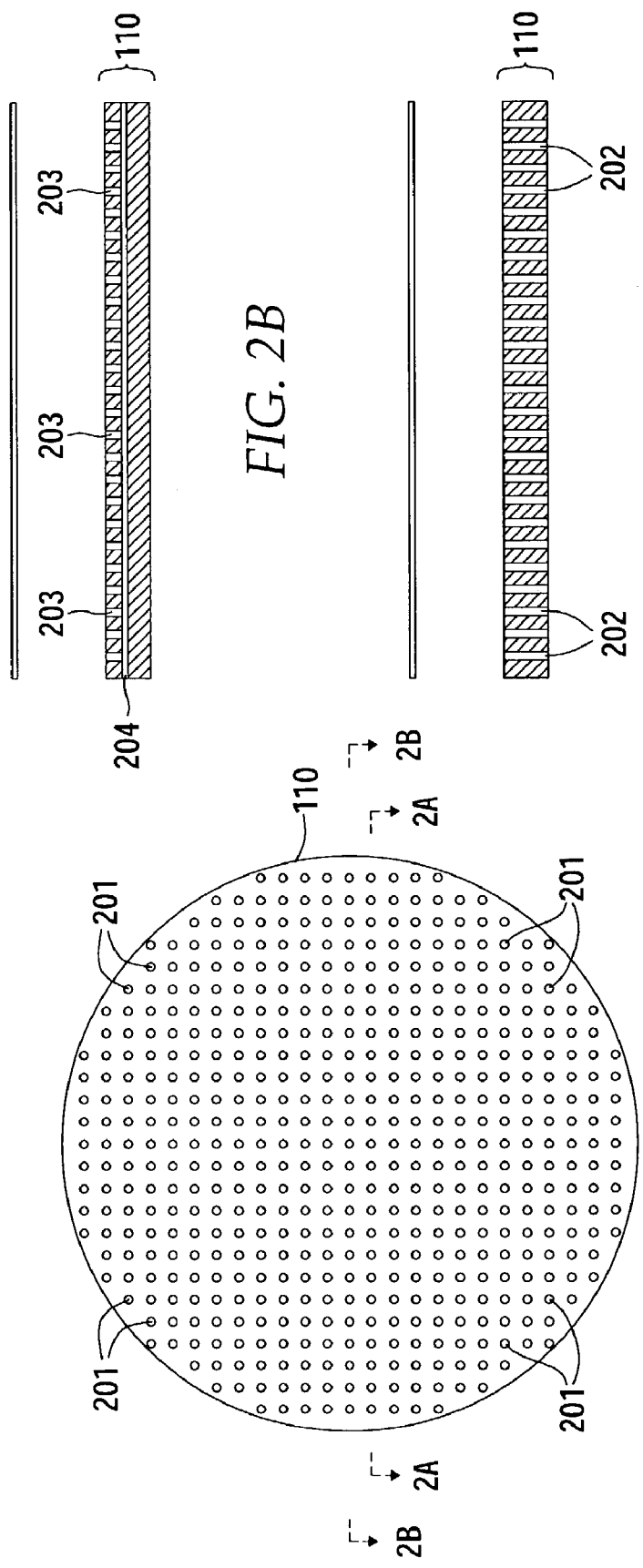
FIG. 2A illustrates a plan view of an exemplary plating membrane of the invention.
FIG. 2B illustrates a first sectional view of an embodiment of a plating membrane of the invention.
FIG. 2C illustrates a second sectional view of an embodiment of a plating membrane 110 of the invention

FIG. 2A illustrates a plan view of the topside of the plating membrane 110. The upper surface or topside of membrane generally includes a plurality of apertures 201 formed therein. Each of apertures 201 are in fluid communication with channels 202 or 203 formed through the interior of plating membrane 110. More particularly, as illustrated in FIGS. 2B and 2C, approximately half of apertures 201 are in fluid communication with fluid supply channels 202, while the other half of apertures are in fluid communication with fluid recirculation channels 203.

FIG. 2B illustrates a first sectional view of an embodiment of a plating membrane 110 of the invention. More particularly, the section of the plating membrane 110 illustrated in FIG. 2B is selected to illustrate the fluid recirculation channels 203 formed through the plating membrane 110 that are configured to remove plating solution from the substrate surface for recycling. Each of the fluid recirculation channels 203 generally runs vertically through the plating membrane 110 and terminates at a drain channel 204 that runs across the plating membrane generally directly below the recirculation channels 203. As such, fluid received in apertures 201 that are in fluid communication with the fluid recirculation channels 203 is generally communication to drain channel 204 by the fluid recirculation channels 203. Drain channel 204 generally operates to communicate the fluid to the perimeter of plating membrane 110, where the fluid may then be captured or otherwise allowed to flow into the outer basin 101 for collection and recirculation to the plating cell.

FIG. 2C illustrates a second sectional view of an embodiment of a plating membrane 110 of the invention. More particularly, the section of the plating membrane 110 illustrated in FIG. 2C is selected to illustrate the fluid channels 202 formed through the plating membrane 110 that are configured to supply fresh electrolyte to the plating surface of the substrate. Fluid supply channels 202 are generally configured to fluidly connect the lower side of the plating membrane 110 to the upper side of the plating membrane, and as such, the plating solution supplied to the volume in the plating cell below the plating membrane 110 may generally flow through the plating membrane 110 from the bottom side to the top side where a substrate is generally positioned during plating operations. The process of flowing fluid through the plating membrane 110 is generally driven by the fluid pressure generated via the supply of plating solution (catholyte) to the volume within inner basin 102 above membrane 108, as the outer perimeter of plating membrane 110 is generally sealed to the wall of inner basin 102 and does not allow plating solution to pass from the bottom side of the plating membrane 110 to the top side of the plating membrane without passing through the membrane 110. As such, the plating solution supplied to the catholyte compartment generally flows into the compartment and through the plating membrane 110 before being captured for recycle.

Figure 3:
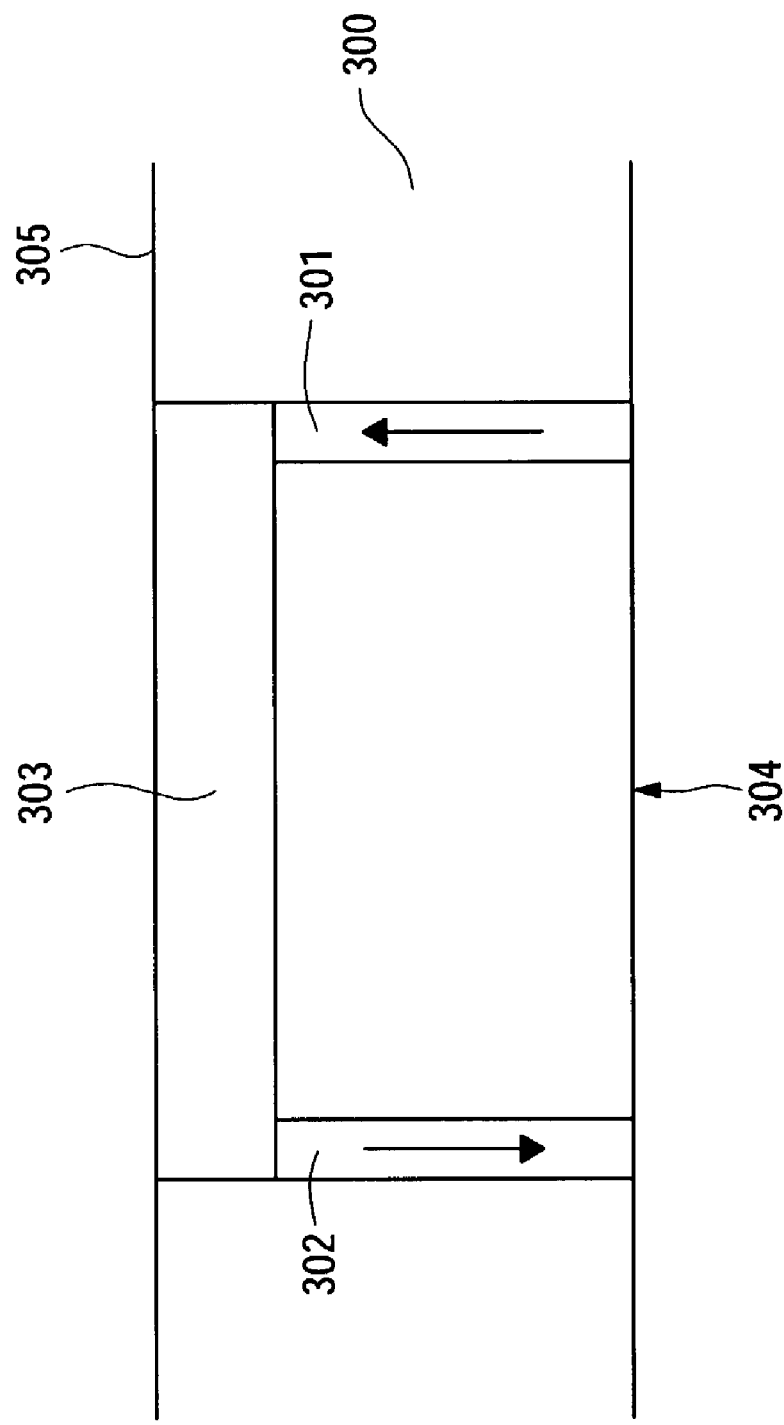
FIG. 3 illustrates a cross sectional view of an exemplary plating membrane of the invention, wherein a fluid supply channel is connected to a fluid drain channel of the membrane via a recess in the membrane.

FIG. 3 illustrates a cross sectional view of an alternative embodiment of the invention, wherein fluid supply channels of a plating membrane 300 are connected to fluid drain channels by a recess in the surface of the plating membrane that is proximate the substrate being plated. The exemplary plating membrane 300 generally includes at least one fluid supply channel 301 that originates on a first or backside 304 of membrane 300 and terminates proximate a second or frontside 305 of membrane 300, wherein the backside 304 generally faces the anode of a plating cell and the frontside 305 is generally in contact with the substrate being plated.

The exemplary plating membrane 300 also generally includes at least one fluid recirculation channel 302 that originates on the frontside 305 of membrane 300 (in recession 303) and terminates proximate backside 304. The frontside 305 generally includes a recession 303 formed therein, wherein the recession 303 interconnects at least one of the fluid supply channels 301 to at least one of the fluid recirculation channels 302. The shape of recession 303 in a plan view may be square, rectangular, triangular, oval, circular, or any other shape that allows for fluid connection of at least one fluid supply channel 301 to at least one fluid recirculation channel. For example, recession may be square shaped in a plan view with a side distance of between about 5 microns and about 100 microns. Similarly, the diameter or cross sectional distance across the respective fluid channels may be between about 1 micron and about 10 microns, for example. Therefore, in this embodiment, the upper surface 305 is brought into contact with a plating surface of a substrate that is within a plating solution. The plating solution is flowed to the plating surface via fluid supply lines 301. The plating solution enters into recession 303 and is allowed to contact and electrochemically react with the plating surface of the substrate. Simultaneously, plating solution is being removed from the recession via fluid recirculation channels 302, which allows fresh plating solution to be continually supplied to the plating surface of the substrate.

In operation, generally a substrate is first brought into a plating position within plating cell 100. More particularly, a head assembly (not shown) generally lowers a substrate from above cell 100 into a plating position, which generally corresponds to position where the plating surface of the substrate is in contact with the plating membrane 110. Once the substrate is positioned in the plating position, the substrate may be rotated while an electrical plating bias is simultaneously applied between the substrate being plated and the anode 105 within plating cell 100. Further, in conjunction with the rotation and application of the electrical plating bias, anolyte and catholyte solutions are generally circulated to the respective chambers within plating cell 100. The application of the plating bias between the substrate and anode 105 generally operates to urge metal ions in the plating solution to plate onto the substrate surface, assuming that the substrate surface is in electrical communication with the cathode terminal of the power supply so that the positive ions in the plating solution are attractive thereto.

More particularly, once a substrate is positioned in a plating position, a plating solution or catholyte solution is generally supplied to the catholyte chamber of cell 100, wherein the catholyte chamber generally corresponds to the volume of cell 100 above membrane 108. Since plating membrane 110 is generally sealably attached to the inner wall of inner basin 102, the plating solution supplied to the catholyte chamber generally causes a slight increase in fluid pressure within the catholyte chamber. This slight increase in fluid pressure is generally sufficient to drive or urge the plating solution within the catholyte chamber through the plating membrane 110. As such, the fluid pressure in catholyte chamber essentially operates to urge the plating solution to pass through plating membrane 110 so that it may contact the plating surface of the substrate being plated and supply plating ions thereto.

The process of flowing the plating solution from the catholyte chamber to the substrate surface being plated generally includes providing sufficient fluid pressure to the catholyte chamber to urge or force the plating solution within the catholyte chamber through plating membrane 110. More particularly, as illustrated in FIG. 2C, plating membrane 110 generally includes a plurality of fluid supply channels 202 formed therethrough that operate to provide a fluid pass from the catholyte chamber to the surface of the substrate being plated, assuming the substrate being plated is in physical contact with the upper surface of plating membrane 110. Thus, one fluid pressure is supplied to the light chamber, the plating solution within the catholyte chamber is caused to travel through fluid supply apertures 202 to the surface of the substrate being plated.

Once the plating solution is supplied to the substrate surface for plating operations, portions of the solution are generally consumed by the plating operation. As such, it is generally necessary to continually supply plating solution to the substrate plating surface in order to maintain plating process. However, the volume between the plating surface and the plating membrane 110 is relatively constant or fixed, and therefore, in order to provide well plating solution to the plating surface of the substrate, the depleted or used plating solution is generally removed therefrom. For example, FIG. 2B illustrates in the fluid recirculation channels 203, which are in fluid communication with a fluid drain channel 204. Fluid drain channel 204 is generally in fluid communication with outer basin 101, and therefore, the used or depleted plating solution that is removed from the plating surface of the substrate via drain channel 204 is supplied to outer basin 101, which operates to collect the used electrolyte and recirculated back into the plating system as required. Therefore, the combination of fluid supply channels 202 and fluid drain channels 203 operate to continually supply fresh electrolyte to the plating surface of the substrate.

Further, as illustrated in FIG. 3, a plating membrane 300 may be modified to interconnect fluid supply channels 301 with fluid drain channels 302 via a recession 303 formed into an upper surface 305 of the plating membrane 300. In this configuration, the recession 303 generally operates to maintain a small volume or pocket of electrolyte in the local area between the respective inlet 301 and outlet 302. As such, the formation of the recession 303 into the upper surface 305 of the plating membrane 300 operates to provide a larger volume of plating solution to the plating surface of the substrate, without separating or increasing the distance between the surface of the substrate and the plating membrane 110. This additional volume of plating solution maintained within recession 303 helps prevent the electrical plating bias from burning the plating membrane.

In another embodiment of the invention, the plating process may be modified to present burning the plating membrane. For example, burning generally occurs when the plating solution between the plating surface and the plating membrane depletes or is not recirculated quickly enough. Since the plating membrane is generally in contact with the plating surface, conventional contact plating apparatuses have difficulty supplying fresh plating solution to the substrate surface, as the contact between the plating membrane and the substrate surface generates resistance to fluid supply. Therefore, embodiments of the invention contemplate a pulsed plating method that may be used to prevent burning of the plating membrane. More particularly, the past plating method generally includes contacting the substrate with the plating membrane for a first period of time, wherein the first period of time generally corresponds to the amount of time it takes to deplete a calculated volume of plating solution from between the plating membrane and the plating surface. Once the first period of time has expired, the plating membrane is removed from direct contact with the plating surface for a second period of time, wherein the second period of time is calculated to allow a sufficient amount of fresh plating solution to be circulated through the plating membrane to supplant plating operations for another period of time equal to the first period of time. In other words, the first period of time is generally the amount of time it takes to deplete the plating solution that may be supplied to the plating membrane and the plating surface, while the second period of time corresponds to the amount of time it takes to circulate to fresh plating solution into the area between the plating surface and membrane. The duration of the pulse, i.e., the duration of the separation between the plating membrane and the plating surface, may be between about 0.01 seconds and about 1 second, for example. More particularly, the pulse duration may be between about 0.1 seconds and about 0.5 seconds. The pulse or separation of the plating membrane from the plating surface of the substrate operates to reduce the fluid flow resistance generated via the contact between the plating membrane and the plating surface so that positive fluid flow through the membrane may be obtained. The positive flow is generally calculated to replenish the electrolyte depleted at the surface of the substrate.

While the foregoing is directed to embodiments of the present invention, other and further embodiments of the invention may be devised without departing from the basic scope thereof, and the scope thereof is determined by the claims that follow

The invention claimed is:

1. A substrate processing system, comprising:
   a fluid basin configured to contain a plating solution therein;
   an anode positioned in a lower portion of the fluid basin;
   a separation membrane positioned in the fluid basin above the anode;
   a diffusion member positioned in the fluid basin above the separation membrane; and
   a plating membrane positioned in the fluid basin above the diffusion member, wherein the plating membrane has:
      a plurality of fluid supply channels connecting a first side of the plating membrane with a second side of the plating membrane, wherein the first side is adjacent the diffusion member and the second side is adjacent a substrate to be plated; and
      a plurality of fluid recirculation channels connecting the second side of the plating membrane with a fluid drain channel formed in the plating membrane.

2. The substrate processing system of claim 1, wherein the diffusion member comprises a fluid permeable ceramic member sealably attached to an inner wall of the fluid basin.

3. The substrate processing system of claim 1, wherein the fluid drain channel is in fluid communication with a fluid recovery basin.

4. The substrate processing system of claim 1, wherein the first side of the plating membrane is in contact with the diffusion member during a plating operation.

5. The substrate processing system of claim 1, further comprising a first fluid inlet configured to supply a catholyte to a volume of the fluid basin above the separation membrane and a second fluid inlet configured to supply an anolyte to a volume of the fluid basin below the separation membrane.

6. The substrate processing system of claim 5, wherein the first fluid inlet is configured to pressurize a volume of fluid positioned above the separation membrane and below the plating membrane.

7. The substrate processing system of claim 6, wherein the pressurized fluid volume operates to urge fluid through the plating membrane.

8. The substrate processing system of claim 1, wherein the separation member comprises an ionic membrane.

9. The substrate processing system of claim 1, wherein a portion of the plating membrane is positioned to rest on a substantially planar upper surface of the diffusion member during plating operations.

10. The substrate processing system of claim 1, wherein the plating membrane has a plurality of recesses configured to contain the plating solution for plating the substrate, wherein each recess connects at least one of the plurality of fluid supply channels with at least one of the plurality of fluid recirculation channels.

11. The substrate processing system of claim 10, wherein the plurality of recirculation channels are configured to remove the plating solution from the plurality of recesses.

12. The substrate processing system of claim 10, wherein the plurality of fluid supply channels are configured to supply the plating solution to the plurality of recesses.

13. The substrate processing system of claim 10, wherein the plating surface of the substrate is configured to contact and electrochemically react with the plating solution disposed inside the plurality of recesses.

14. A substrate processing system, comprising:
   a fluid basin configured to contain a plating solution therein;
   an anode positioned in a lower portion of the fluid basin;
   a separation membrane positioned in the fluid basin above the anode;
   a diffusion member positioned in the fluid basin above the separation membrane; and
   a plating membrane positioned in the fluid basin above the diffusion member, wherein the plating membrane has:
      a plurality of fluid supply channels connecting a first side of the plating membrane with a second side of the plating membrane, wherein the first side is adjacent the diffusion member and the second side is adjacent a substrate to be plated;
      a plurality of fluid recirculation channels connecting the second side of the plating membrane with a fluid drain channel formed into the plating membrane; and
      a plurality of recesses, wherein each recess connects at least one of the fluid supply channels with at least one of the fluid recirculation channels and wherein each recess is configured to contain the plating solution for plating the substrate.

15. The substrate processing system of claim 14, wherein the fluid drain channel is in fluid communication with a fluid recovery basin.

* * * * *

UNITED STATES PATENT AND TRADEMARK OFFICE
CERTIFICATE OF CORRECTION

PATENT NO. : 7,025,861 B2 Page 1 of 1
APPLICATION NO. : 10/360234
DATED : April 11, 2006
INVENTOR(S) : Nicolay Kovarsky, Michael Yang and Dmitry Lubomirsky It is certified that error appears in the above-identified patent and that said Letters Patent is hereby corrected as shown below:

On Title page

Item [83], Assignee: Change Assignee's name from "Applied Materials" to --Applied Materials, Inc.--

Column 4, Line 21: Delete the hyphen before "outer"

Column 8, Line 49: Change "present" to --prevent--

Column 9, Line 10: After" circulate", delete "to"

Column 9, Line 28: Insert a period after "follow"

Signed and Sealed this

Fifteenth Day of August, 2006

JON W. DUDAS
*Director of the United States Patent and Trademark Office*